United States Patent
Lee

(10) Patent No.: US 8,139,429 B2
(45) Date of Patent: Mar. 20, 2012

(54) OUTPUT ENABLE SIGNAL GENERATING CIRCUIT AND METHOD OF SEMICONDUCTOR MEMORY APPARATUS

(75) Inventor: Hyeng Ouk Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 12/970,541

(22) Filed: Dec. 16, 2010

(65) Prior Publication Data

US 2011/0085395 A1    Apr. 14, 2011

Related U.S. Application Data

(62) Division of application No. 12/181,890, filed on Jul. 29, 2008, now Pat. No. 7,869,288.

(51) Int. Cl.
*G11C 7/00* (2006.01)
*G11C 8/00* (2006.01)

(52) U.S. Cl. ........ 365/191; 365/193; 365/194; 365/196; 365/233.1

(58) Field of Classification Search .......... 365/191, 365/193, 194, 196, 233.1
See application file for complete search history.

(56) References Cited

U.S. PATENT DOCUMENTS

| | | | |
|---|---|---|---|
| 6,446,180 B2 | 9/2002 | Le et al. | |
| 6,982,924 B2 | 1/2006 | Na | |
| 6,987,705 B2 | 1/2006 | Kim et al. | |
| 7,081,784 B2 | 7/2006 | Kang | |
| 2004/0099883 A1* | 5/2004 | Jung | 257/200 |
| 2005/0078548 A1 | 4/2005 | Kang et al. | |
| 2006/0103444 A1 | 5/2006 | Kang | |
| 2008/0111596 A1 | 5/2008 | Lee | |
| 2008/0232180 A1* | 9/2008 | Kim et al. | 365/194 |
| 2009/0073787 A1* | 3/2009 | Lee | 365/194 |
| 2009/0168568 A1* | 7/2009 | Park | 365/194 |

FOREIGN PATENT DOCUMENTS

| | | |
|---|---|---|
| JP | 2004-327008 | 11/2004 |
| KR | 1020010035850 | 5/2001 |
| KR | 1020050101865 | 10/2005 |

* cited by examiner

*Primary Examiner* — Ly D Pham
(74) *Attorney, Agent, or Firm* — Baker & McKenzie LLP

(57) ABSTRACT

An output enable signal generating circuit for a semiconductor memory apparatus includes an output control unit configured to receive CAS latency information and to generate an output control signal having enable timing according to a DLL on/off mode, and an output enable signal output unit configured to receive the output control signal and to output an output enable signal in response to a read command and a DLL clock signal.

6 Claims, 8 Drawing Sheets

OUTPUT ENABLE SIGNAL GENERATING CIRCUIT AND METHOD OF SEMICONDUCTOR MEMORY APPARATUS

CROSS-REFERENCE TO RELATED PATENT APPLICATION

This is a divisional application of U.S. patent application Ser. No. 12/181,890, filed on Jul. 29, 2008, which is incorporated herein in its entirety by reference as if set forth in full, and which claims the benefit under 35 U.S.C. 119(a) of Korean Application No. 10-2007-0080513, filed on Aug. 10, 2007, in the Korean Intellectual Property Office, the disclosure of which is incorporated herein in its entirety by reference as if set forth in full.

BACKGROUND

1. Technical Field

The embodiments described herein relate to a semiconductor memory apparatus, and in particular, to an output enable signal generating circuit and method for a semiconductor memory apparatus.

2. Related Art

In general, semiconductor memory apparatuses output data after CAS (Column Address Strobe) latency, which is based on a clock transmitted from a DLL (Delay Locked Loop) circuit and is specified in a number of clock cycles. In order to buffer output data, a conventional semiconductor apparatus is required to set a buffering interval for the output data. In order to set a buffering interval for the output data, a conventional semiconductor memory apparatus is provided with an output enable signal generating circuit. If receiving a read command, the output enable signal generating circuit generates an output enable signal on the basis of CAS latency information and a DLL clock.

A conventional semiconductor memory apparatus generally uses a DLL circuit to generate DLL clock signals and occasionally use a DLL off mode under specific conditions. For example, when an apparatus for testing a semiconductor memory apparatus operates at a relatively low frequency, or when it is required to significantly reduce power consumption is called for in the semiconductor apparatus, the DLL off mode is used. Whether to use the DLL off mode is determined according to whether a DLL on mode signal is enabled.

Referring to FIG. 1, a conventional semiconductor memory apparatus includes a read command generator 1, a DLL circuit 2, an output enable signal generating circuit 3, a core circuit 4, and a data output buffer 5.

The read command generator 1 generates a read command 'RD_cmd' in response to an external clock signal 'clk_ext' and an external read command 'RD_cmdext'. The DLL circuit 2 receives the external clock signal 'clk_ext' and generates a DLL clock signal 'clk_dll'. The output enable signal generating circuit 3 receives a reset signal 'rst', a CAS latency signal 'CL', a DLL on mode signal 'donmd', the read command 'RD_cmd', the DLL clock signal 'clk_dll', and the external clock signal 'clk_ext', and generates an output enable signal 'outen'. The core circuit 4 ouputts a GIO data signal 'd_gio' in response to the external read command 'RD_cmdext'. The data output buffer 5 outputs an output data signal 'd_out' in response to the output enable signal 'outen' and the GIO data signal 'd_gio'.

Referring to FIG. 2, the output enable signal generating circuit 3 includes a CAS latency delay unit 31, a data output delay control unit 32, an output enable signal output unit 33, a DLL off output enable signal generating unit 34, and an output enable multiplex unit 35.

The CAS latency delay unit 31 generates a CAS latency delay signal 'CL_dly' in response to the CAS latency signal 'CL', the external clock signal 'clk_ext', and the reset signal 'rst'. The data output delay control unit 32 generates an output enable delay signal 'oedly' in response to the reset signal 'rst' and the CAS latency delay signal 'CL_dly'. The output enable signal output unit 33 generates a DLL on output enable signal 'outen_don' in response to the read command 'RD_cmd', the output enable delay signal 'oedly', the DLL clock signal 'clk_dll', and the DLL on mode signal 'donmd'.

The DLL off output enable signal generating unit 34 generates a DLL off output enable signal 'outen_doff' in response to the read command 'RD_cmd', the DLL clock signal 'clk_dll', and the DLL on mode signal 'donmd'. The output enable multiplex unit 35 outputs the DLL on output enable signal 'outen_don' or the DLL off output enable signal 'outen_doff' as an output enable signal 'outen'.

The CAS latency delay unit 31 may be implemented as a shift register that shifts the CAS latency signal 'CL' in sync with the external clock signal 'clk_ext'.

Referring to FIG. 3, the data output delay unit 32 includes a replica delay unit REPDL, a first inverter IV1, a second inverter IV2, a first NAND gate ND1, and a NOR gate NR.

The replica delay unit REPDL receives the reset signal 'rst'. The first inverter IV1 receives an output signal of the replica delay unit REPDL. The first NAND gate ND1 receives the reset signal 'rst' and an output signal of the first inverter IV1. The second inverter IV2 receives an output signal of the first NAND gate ND1. The NOR gate NR receives an output signal of the second inverter IV2 and the CAS latency delay signal 'CL_dly', and outputs the output enable delay signal 'oedly'.

The reset signal 'rst' is often implemented as a low enable signal.

Referring to FIG. 4, the DLL off output enable signal generating unit 34 includes a delay unit DLY, a plurality of second NAND gates ND2<1:n−1>, and a plurality of flip-flops FF<1:n−1 >.

The delay unit DLY delays the read command 'RD_cmd' and outputs the delayed read command 'RD_cmddly'.

The CAS latency signal is often implemented as a plurality of signals 'CL<2:n>', which are enabled according to the length of CAS latency.

The plurality of second NAND gates ND2<1:n−1> each receive the delayed read command 'RD_cmddly' and one of the plurality of CAS latency signals 'CL<2:n>' that is pre-assigned thereto. The plurality of flip-flops FF<1:n−1> each receive the reset signal 'rst', the DLL clock signal 'clk_dll', an output signal of one of the plurality of second NAND gates ND2<1:n−1> pre-assigned thereto, and an output signal of the preceding flip-flop. The (n−1)th flip-flop FF<n−1> outputs the DLL off output enable signal 'outen_doff'.

In a DLL on mode, the phase of the internal clock signal (that is, the DLL clock signal) is earlier than the phase of the external clock signal. In contrast, in a DLL off mode, the phase of the internal clock signal is later than the phase of the external clock signal. Therefore, the timing from when the read command is input until data is output is larger in the DLL off mode, as compared to the DLL on mode. In the case where the CAS latency is 4, data should be output four cycles of the external clock signal after the read command is input. Thus, in the DLL on mode, the output enable signal generating circuit generates an output enable signal having an enable interval of four cycles of the external clock signal, corresponding to the four cock cycles that follow reception of the read command.

In contrast, in the DLL off mode, the output enable signal generating circuit generates an output enable signal having an enable interval that begins four cycles of the external clock signal after reception of the read command.

In order to generate output enable signals having different enable timing in the DLL on mode and in the DLL off mode, a conventional output enable signal generating circuit for a semiconductor memory apparatus often includes a circuit for generating an output enable signal in the DLL on mode and a circuit for generating an output enable signal in the DLL off mode. Accordingly, the area occupied by the output enable signal generating circuit is relatively large, which reduces the area efficiency of the apparatus.

Increased integration is critical for many conventional semiconductor apparatus. Accordingly, the reduced area efficiency that results from supporting both a DLL on mode and a DLL off mode has a significant negative impact.

SUMMARY

An output enable signal generating circuit that occupies a reduced area, thereby improving the area efficiency is described herein.

According to one aspect, an output enable signal generating circuit for a semiconductor memory apparatus includes an output control unit configured to receive CAS latency information and to generate an output control signal having enable timing according to a DLL on/off mode, and an output enable signal output unit configured to receive the output control signal and to output an output enable signal in response to a read command and a DLL clock signal.

According to another aspect, an output enable signal generating circuit for a semiconductor memory apparatus includes a DLL off delay control unit configured to generate a DLL off output delay signal in response to CAS latency delay signal, a switching unit to output the DLL off output delay signal as an output control signal in a DLL off mode, and an output enable signal output unit to receive the output control signal and to output an output enable signal in response to a read command and a DLL clock signal.

According to still another embodiment, an output enable signal generating method for a semiconductor memory apparatus includes generating a CAS latency delay signal in response to a CAS latency signal, generating a DLL on output delay signal and a DLL off output delay signal in response to the CAS latency delay signal, selecting the DLL on output delay signal or the DLL off output delay signal as an output control signal according to a DLL on/off mode, and generating an output enable signal from the output control signal in response to a read command and a DLL clock signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
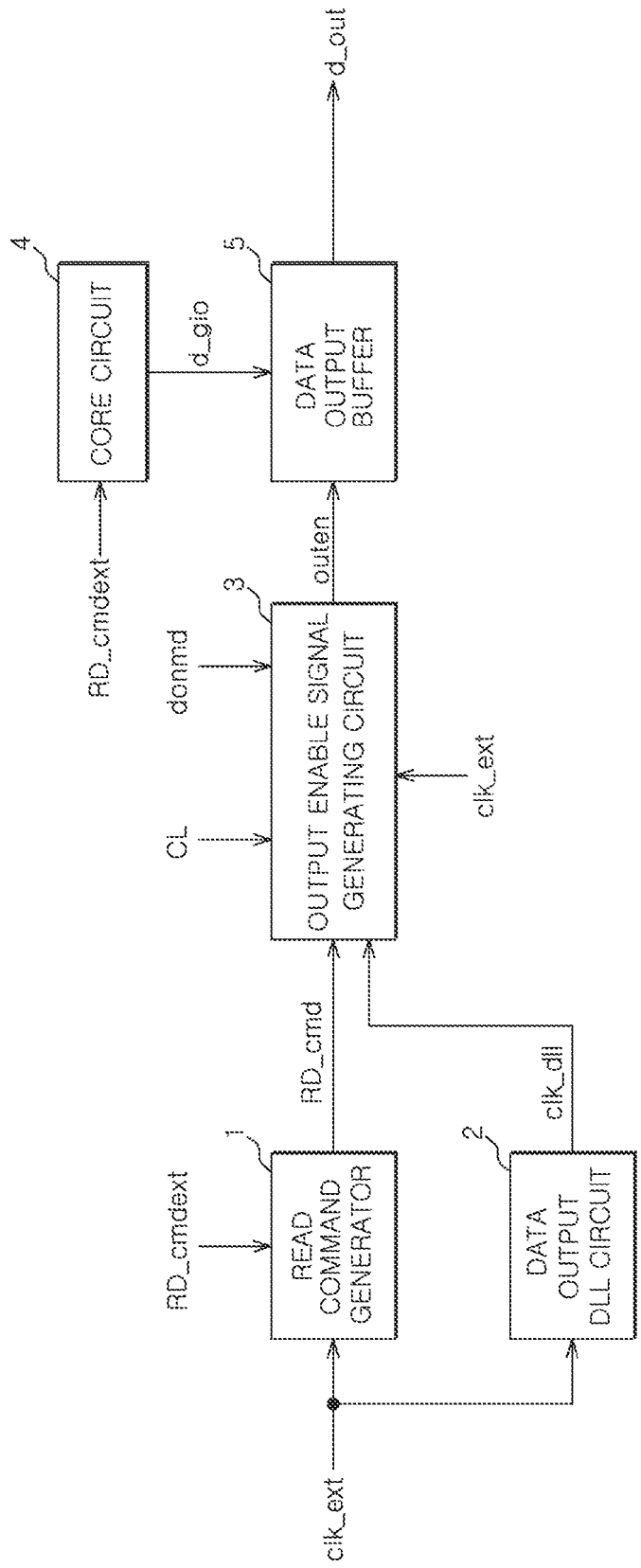
FIG. 1 is a block diagram illustrating a conventional semiconductor memory apparatus.
Figure 2:
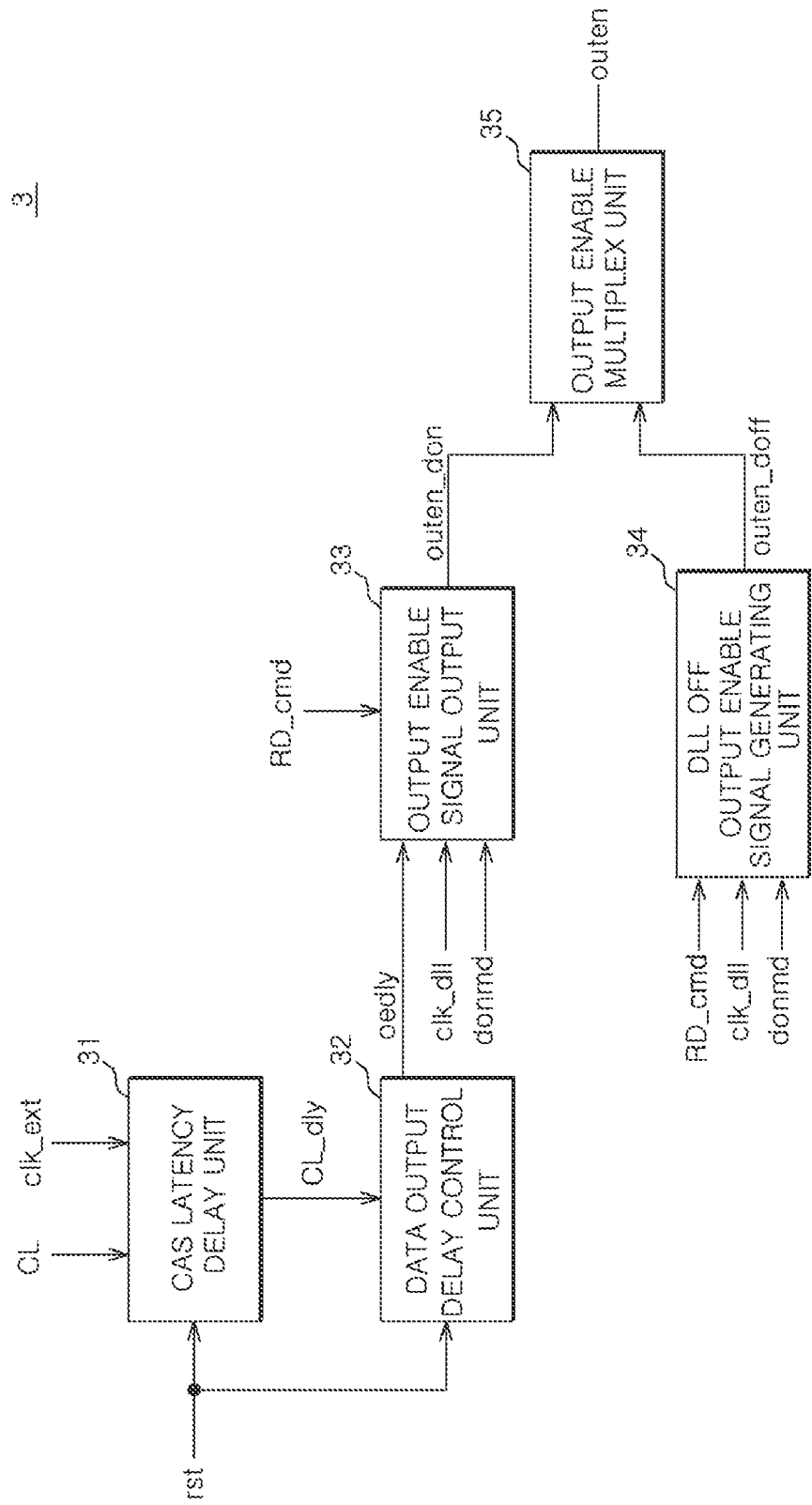
FIG. 2 is a block diagram illustrating an output enable signal generating circuit that can be included in the apparatus shown in FIG. 1.
Figure 3:
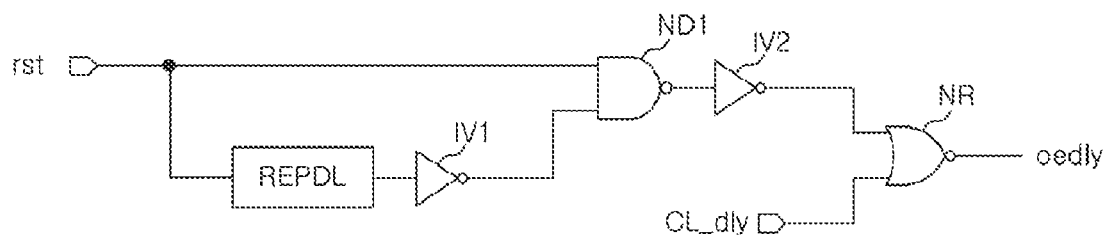
FIG. 3 is a diagram illustrating a data output delay control unit that can be included in the circuit shown in FIG. 2.
Figure 4:
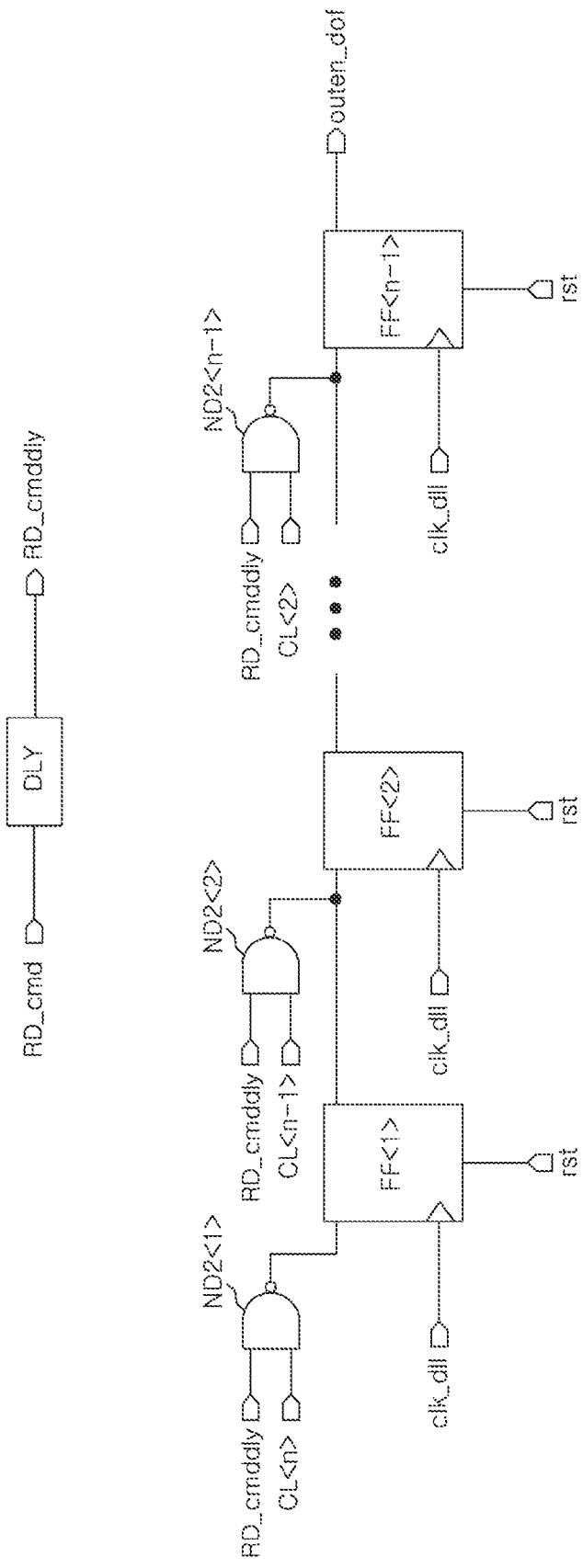
FIG. 4 is a diagram illustrating a DLL off output enable signal generating unit that can be included in the circuit shown in FIG. 2
Figure 5:
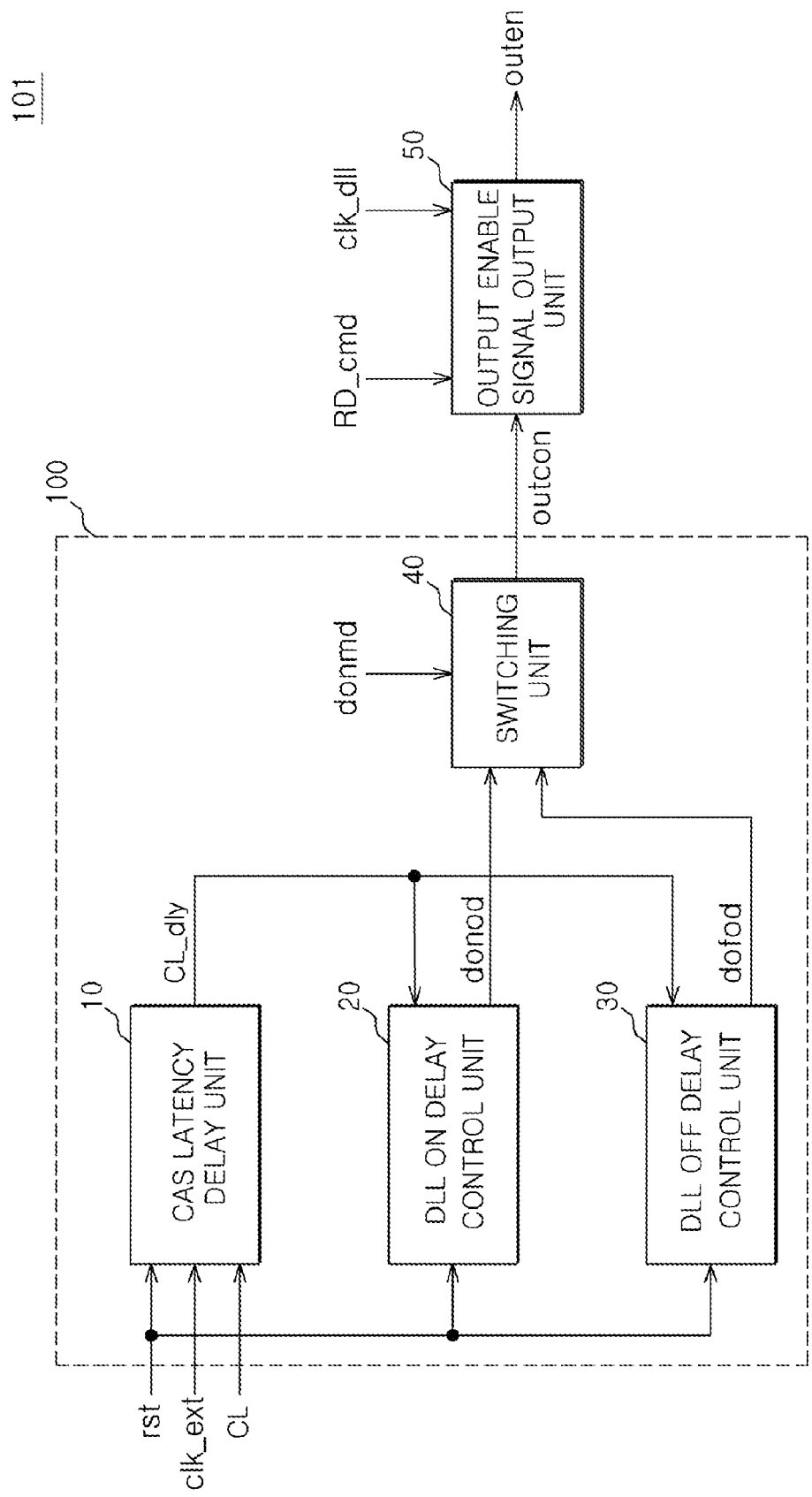
FIG. 5 is a block diagram illustrating an output enable signal generating circuit for a semiconductor memory apparatus according to one embodiment.

FIG. 5 is a diagram illustrating an output enable signal generating unit 101 configured in accordance with one embodiment. Referring to FIG. 5, the output enable signal generating circuit 101 can include a CAS latency delay unit 10, a DLL on delay control unit 20, a DLL off delay control unit 30, a switching unit 40, and an output enable signal output unit 50.

The CAS latency delay unit 10 can be configured to generate a CAS latency delay signal 'CL_dly' in response to a reset signal 'rst', an external clock signal 'clk_ext', and a CAS latency signal 'CL'. The CAS latency signal 'CL' can be a signal representing predetermined CAS latency information. The CAS latency delay unit 10 can be configured to determine the enable timing of the CAS latency delay signal 'CL_dly' according to the CAS latency information carried on the CAS latency signal 'CL'. In other words, if CAS latency is 4, then the CAS latency delay unit 10 can enable the CAS latency delay signal 'CL_dly' when four cycles of the external clock signal 'clk_ext' pass since the CAS latency delay unit 10 is initiated by the reset signal 'rst'.

The DLL on delay control unit 20 can be configured to generate a DLL on output delay signal 'donod' in response to the reset signal 'rst' and the CAS latency delay signal 'CL_dly'. The DLL on output delay signal 'donod' can be used to determine the enable timing of an output enable signal 'outen' when the output enable signal generating circuit operates in an DLL on mode.

The DLL off delay control unit 30 can be configured to generate a DLL off output delay signal 'dofod' in response to the reset signal 'rst' and the CAS latency delay signal 'CL_dly'. The DLL off output delay signal 'dofod' can allow the determination of the enable timing of the output enable signal 'outen' when the output enable signal output circuit operates in an DLL off mode.

The switching unit 40 can be configured to output the DLL on output delay signal 'donod' or the DLL off output delay signal 'dofod' as an output control signal 'outcon' in response to a DLL on mode signal 'donmd'. In other words, the switching unit 40 can output the DLL on output delay signal 'donod' as the output control signal 'outcon' if the DLL on mode signal 'donmd' is enabled, and output the DLL off output delay signal 'dofod' as the output control signal 'outcon' if the DLL on mode signal 'donmd' is disabled.

The output enable signal output unit 50 can be configured to receive the output control signal 'outcon' and output the output enable signal 'outen' in response to a read command 'RD_cmd' and a DLL clock signal 'clk_dll'. When an amount of time corresponding to an enable interval of the output control signal 'outcon' elapses since the read command 'RD_cmd' is input, the output enable signal output unit 50 can enable the output enable signal 'outen'. Accordingly, the output enable signal 'outen' can be enabled when predetermined time elapses since the external read command is input to the semiconductor memory apparatus. The predetermined time can be the time during which the read command 'RD_cmd' is transmitted to the output enable signal output unit 50 since an external read command is input to a semiconductor memory apparatus plus the time corresponding to the enable interval of the output control signal 'outcon'.

Here, the CAS latency delay unit 10, the DLL on delay control unit 20, the DLL off delay control unit 30, and the switching unit 40 can be generally referred to as an output control unit 100.

As described above, the output enable signal generating circuit 101 can be configured to generate the DLL on output delay signal 'donod' by using the DLL on delay control unit 20, generate the DLL off output delay signal 'dofod' by using the DLL off delay control unit 30, and then generate the output control signal 'outcon' from the DLL on output delay signal 'donod' or the DLL off output delay signal 'dofod' according to the DLL on/off mode. Therefore, only one output enable signal output unit 50 is needed to provide both the DLL on and off mode. As a result, the area occupied by circuit 101 is significantly reduced, as compared to that for a conventional output enable signal generating circuit.

Figure 6:
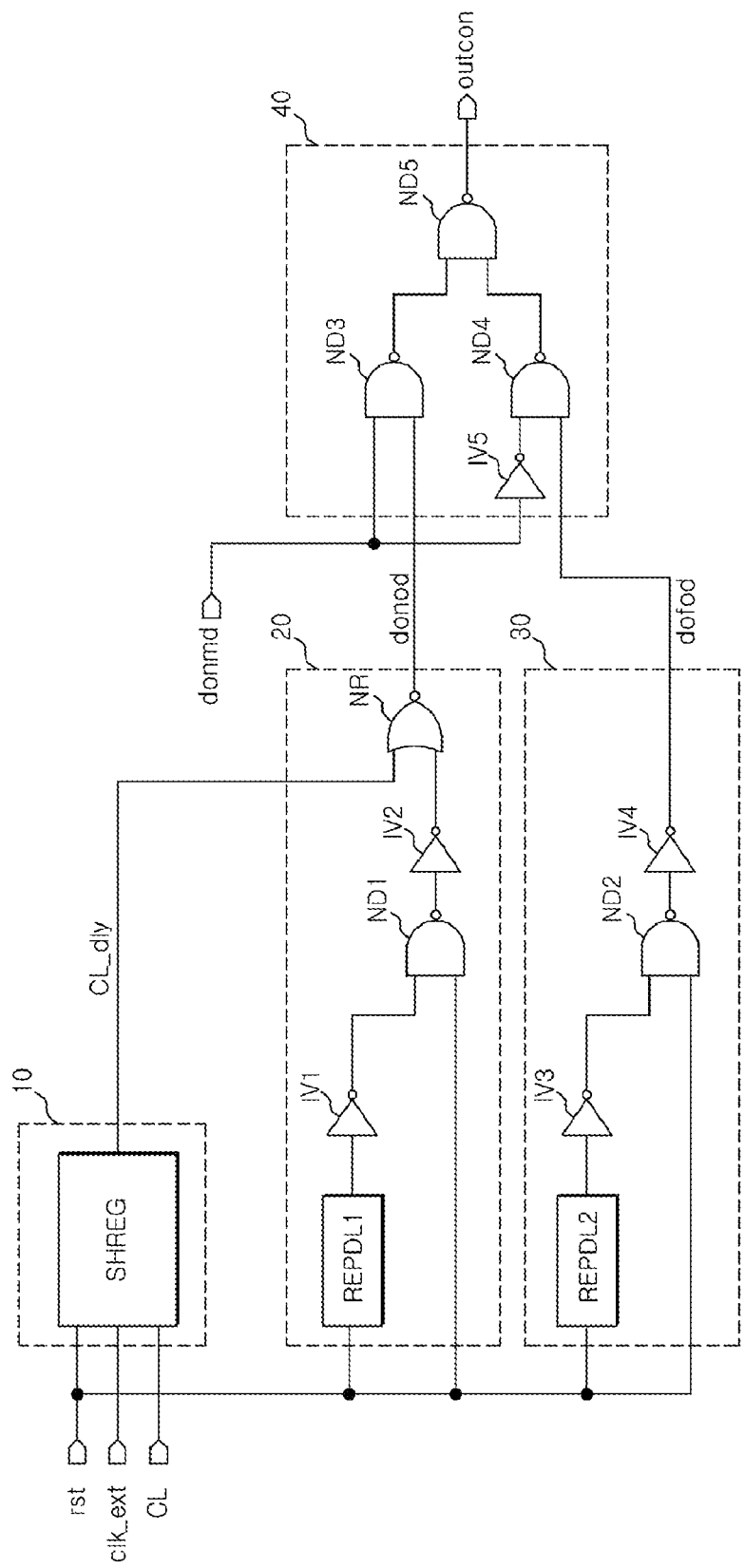
FIG. 6 is a diagram illustrating an output control unit that can be included in the circuit shown in FIG. 5.

Referring to FIG. 6, the CAS latency delay unit 10 can include a shift register SHREG configured to shift the reset signal 'rst' under the control of the external clock signal 'clk_ext' and based on the CAS latency signal 'CL', and to output the shifted signal as the CAS latency delay signal 'CL_dly'.

The DLL on delay control unit 20 can include a first replica delayer REPDL1, a first inverter IV1, a second inverter IV2, a first NAND gate ND1, and a NOR gate NR.

The first replica delayer REPDL1 can be configured to delay the reset signal 'rst' by a predetermined first time period. The first inverter IV1 can receive an output signal of the first replica delayer REPDL1. The first NAND gate ND1 can receive the reset signal 'rst' and an output signal of the first inverter IV1. The second inverter IV2 can receive an output signal of the first NAND gate ND1. The NOR gate NR can receive the CAS latency delay signal 'CL_dly' and an output signal of the second inverter IV2 and output the DLL on output delay signal 'donod'.

The DLL off delay control unit 30 can include a second replica delayer REPDL2, a third inverter IV3, a fourth inverter IV4, and a second NAND gate ND2.

The second replica delayer REPDL2 can be configured to delay the reset signal 'rst' by a second predetermined time period. The third inverter IV3 can be configured to receive an output signal of the second replica delayer REPDL2. The second NAND gate ND2 can receive the reset signal 'rst' and an output signal of the third inverter IV3. The fourth inverter IV4 can receive an output signal of the second NAND gate ND2 and output the DLL off output delay signal 'dofod'.

The switching unit 40 can include third to fifth NAND gates ND3 to ND5 and a fifth inverter IV5.

The third NAND gate ND3 can receive the DLL on output delay signal 'donod' and the DLL on mode signal 'donmd'. The fifth inverter IV5 can receive the DLL on mode signal 'donmd'. The fourth NAND gate ND4 can receive the DLL off output delay signal 'dofod' and an output signal of the fifth inverter IV5. The fifth NAND gate ND5 can receive an output signal of the third NAND gate ND3 and an output signal of the fourth NAND gate ND4 and output the output control signal 'outcon'.

The reset signal 'rst' can be implemented as a low enable signal.

The shift register SHREG of the CAS latency delay unit 10 can be implemented as a general shift register. For example, if the CAS latency signal 'CL' carries information that the CAS latency is 4, then the shift register SHREG can be configured to delay the reset signal 'rst' by four cycles of the external clock signal 'clk_ext'. The CAS latency delay signal 'CL_dly' can be generated by the above-mentioned operations.

A delay value for defining enable timing of the output enable signal 'outen' in the DLL on mode can be preset to the first replica delayer REPDL1 of the DLL on delay control unit 20. Due to the delay value of the first replica delayer REPDL1, the output signal of the second inverter IV2 can be implemented so that it is enabled when the reset signal 'rst' is disabled, and is then disabled when the sum of a command delay time and a data output delay time elapses. Here, the command delay time means delay time from when the external read command is transmitted to the output enable signal generating circuit as the read command 'RD_cmd', and the data output delay time means an interval of time from when the output enable signal 'outen' is enabled to when actual data is output. Accordingly, the DLL on output delay signal 'donod' can be enabled if the output signal of the second inverter IV2 is disabled, and can be disabled if the CAS latency delay signal 'CL_dly' is enabled.

Similarly, a delay value for defining enable timing of the output enable signal 'outen' in the DLL off mode can be preset to the second replica delayer REPDL2 of the DLL off delay control unit 30. The DLL off output delay signal 'dofod' can be implemented so that it is enabled if the reset signal 'rst' is disabled, and can be disabled if the output signal of the second replica delayer REPDL2 is enabled.

The output signal of the second replica delayer REPDL2 can be enabled when a predetermined time elapses since the reset signal 'rst' is disabled. The predetermined time can be obtained by subtracting the command delay time from the sum of CAS latency delay time and DLL off delay time. Here, the CAS latency delay time means an interval of time from when the reset signal 'rst' is disabled to when the CAS latency delay signal 'CL_dly' is enabled, and the DLL off delay time means the delay time of the DLL clock signal 'clk_dll' with respect to the external clock signal 'clk_ext' in the DLL off mode.

Thus, the output control signal 'outcon' output from the switching unit 40 can be implemented so that it has different enable timings according to the DLL on/off mode.

Figure 7A:
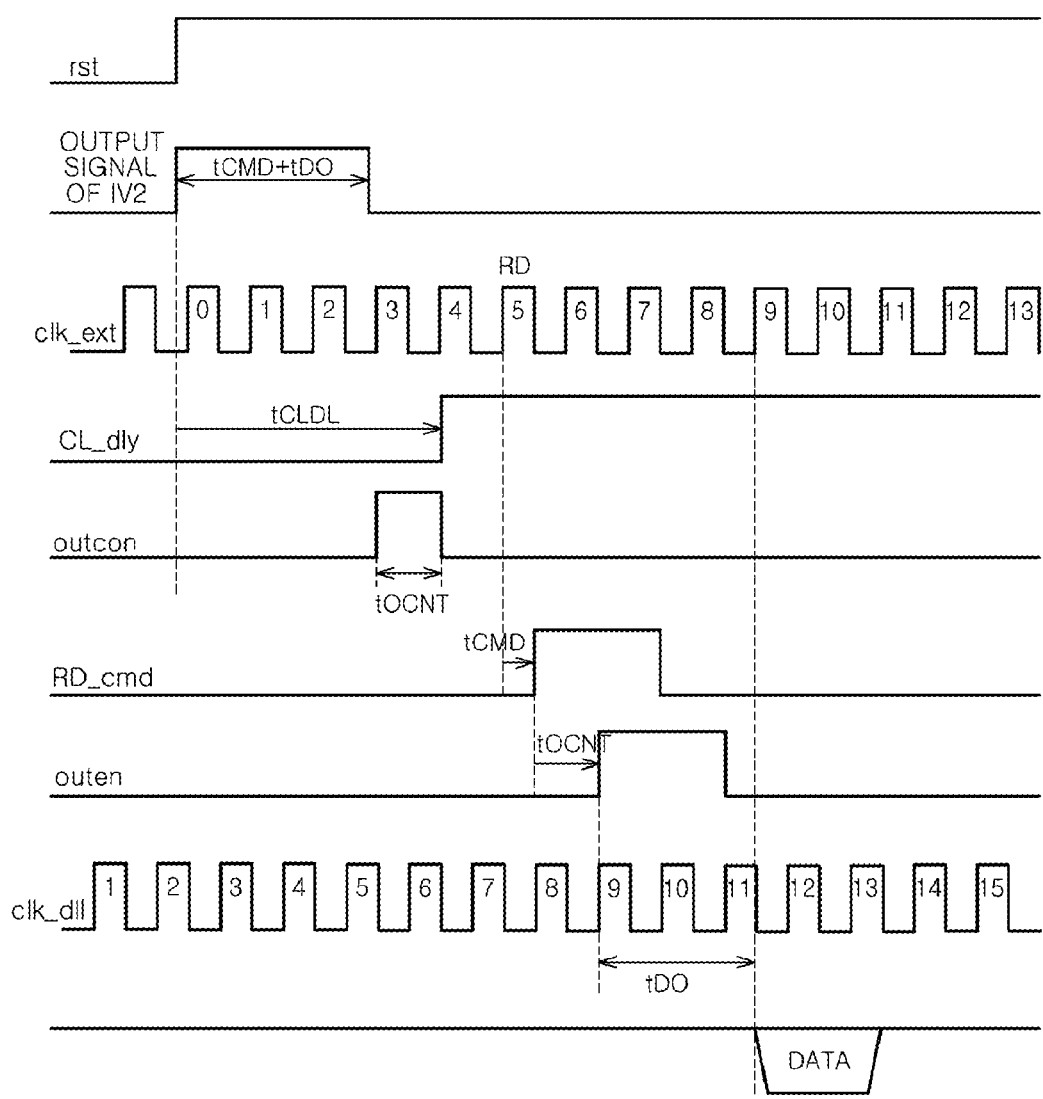
FIG. 7A and FIG. 7B are timing charts illustrating the operation of the output enable signal generating circuit shown in FIG. 5.
Figure 7B:
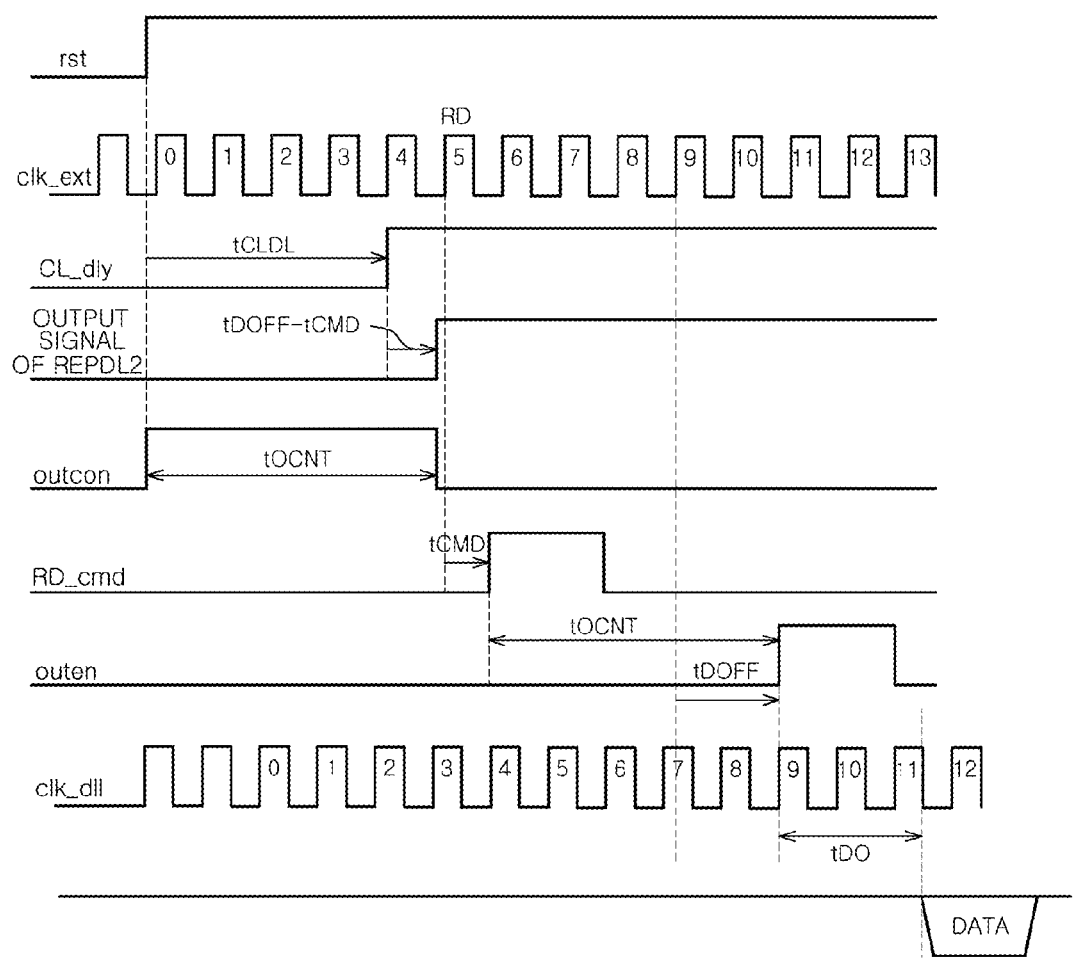

FIGS. 7A and 7B are timing charts illustrating the operations of the output enable signal generating circuit 101. FIG. 7A illustrates an operation in the DLL on mode, and FIG. 7B illustrates an operation in the DLL off mode. This can be confirmed due to the timing differences between the DLL clock signal 'clk_dll' and the external clock signal 'clk_ext'. Here, it is assumed that the CAS latency is 4.

Referring to FIG. 7A, an enable interval of the output signal of the second inverter IV2 of the DLL on delay control unit 20 is defined as a interval from when the reset signal 'rst' is disabled to when the sum of the command delay time (tCMD) and the data output delay time (tDO) elapses from disable timing of the reset signal 'rst'. Further, an enable interval (tOCNT) of the output control signal 'outcon' is defined by a time from when the output signal of the second inverter IV2 is disabled and the CAS latency delay time (tCLDL). The read command 'RD_cmd' is enabled when the command delay time (tCMD) elapses after the input of the external read command. The output enable signal 'outen' is enabled when the enable interval (tOCNT) of the output control signal 'outcon' elapses after the read command 'RD_cmd' is enabled. Then, when the data output delay time (tDO) elapses, a data output operation is performed.

Referring to the CAS latency delay signal 'CL_dly' and the output signal of the second replica delayer REPDL2 shown in FIG. 7B, the enable interval (tOCNT) of the output control signal 'outcon' is defined as a interval from when the reset signal 'rst' is disabled to when a predetermined time elapses since the reset signal 'rst' is disabled. Here, the predetermined time is obtained by adding, to the CAS latency delay time (tCLDL), time obtained by subtracting the command delay time (tCMD) from the DLL off delay time (tDOFF). The output enable signal 'outen' is enabled when the sum of the command delay time (tCMD) and time corresponding to the enable interval (tOCNT) of the output enable signal 'outen' elapses since the input timing RD of the external read command. When the data output delay time (tDO) elapses since the output enable signal 'outen' is enabled, data is output.

As described above, the output enable signal generating circuit 101 can be configured to generate the output control signal having variable enable timing according to the DLL on/off mode and can generate the output enable signal based thereon. Therefore, even though it has only one output control unit and one output enable signal output unit, it can perform a normal output enable signal generating operation according to the DLL on/off mode. As a result, the occupied area thereof is significantly reduced. In short, the output enable signal generating circuit 101 reduces the occupied area thereof, resulting in the high degree of integration for semiconductor memory apparatuses.

Further, today's semiconductor memory apparatus often use a high-frequency clock signal for the operation thereof even in the DLL off mode. In the embodiments described herein, even in the DLL off mode, a phase difference between the DLL clock signal and external clock signal can be compensated and accordingly a stable data output operation can be supported even during high frequency operation.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An output enable signal generating circuit for a semiconductor memory apparatus, the circuit comprising:
    a DLL off delay control unit configured to generate a DLL off output delay signal in response to CAS latency delay signal;
    a switching unit configured to output the DLL off output delay signal as an output control signal in a DLL off mode; and
    an output enable signal output unit configured to receive the output control signal and to output an output enable signal in response to a read command and a DLL clock signal.

2. The output enable signal generating circuit of claim 1, wherein the DLL off delay control unit includes a replica delayer that is configured to set a delay value for determining enable timing of the output enable signal in a DLL off mode, and to generate the DLL off output delay signal, and wherein the DLL off output delay signal is enabled when the reset signal is disabled, and is disabled when the sum of time from when the reset signal is disabled to when the CAS latency delay signal is enabled and time obtained by subtracting time during which an external read command is transmitted as the read command from the sum of time from disable timing of the reset signal to enable timing of the CAS latency delay signal and delay time which a DLL clock signal has with respect to the external clock signal in the DLL off mode elapses since the disable time of the reset signal.

3. The output enable signal generating circuit of claim 1, wherein the output enable signal output unit is configured to enable the output enable signal when time corresponding to an enable interval of the output control signal elapses since the read command is input.

4. The output enable signal generating circuit of claim 1, further comprising:
    a CAS latency delay unit configured to generate a CAS latency delay signal in response to a reset signal, an external clock signal, and the CAS latency signal; and
    a DLL on delay control unit configured to generate a DLL on output delay signal in response to the reset signal and the CAS latency delay signal, wherein the switching unit is configured to output the DLL on output delay signal as the output control signal in a DLL on mode.

5. The output enable signal generating circuit of claim 4, wherein the CAS latency delay unit is configured to determine enable timing of the CAS latency delay signal according to the CAS latency information.

6. The output enable signal generating circuit of claim 4, wherein the DLL on delay control unit includes a replica delayer that is configured to set a delay value for determining enable timing of the output enable signal in a DLL on mode, and to generate the DLL on output delay signal, and wherein the DLL on output delay signal is enabled if the sum of time during which an external read command is transmitted as the read command and time from when the output enable signal is enabled to when actual data is output elapses since disable timing of the reset signal, and is disabled if the CAS latency delay signal is enabled.

* * * * *